United States Patent
Slawecki et al.

(12)
(10) Patent No.: US 6,892,157 B2
(45) Date of Patent: May 10, 2005

(54) ON-DIE AUTOMATIC SELECTION OF MANIPULATED CLOCK PULSE

(75) Inventors: Darren Slawecki, Santa Clara, CA (US); Stephan Rotter, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 720 days.

(21) Appl. No.: 09/895,462

(22) Filed: Jun. 28, 2001

(65) Prior Publication Data

US 2003/0005366 A1 Jan. 2, 2003

(51) Int. Cl.$^7$ ............................................... G06F 19/00
(52) U.S. Cl. ........................................... 702/125; 438/6
(58) Field of Search ............................. 702/125; 438/6, 438/14

(56) References Cited

U.S. PATENT DOCUMENTS

| | | | | |
|---|---|---|---|---|
| 5,239,481 A | * | 8/1993 | Brooks et al. ................... 716/6 |
| 5,790,200 A | * | 8/1998 | Tsujimoto et al. ........... 348/545 |
| 6,127,858 A | | 10/2000 | Stinson et al. | |
| 6,237,115 B1 | * | 5/2001 | Ting et al. .................... 714/718 |
| 6,549,022 B1 | * | 4/2003 | Cole et al. .................... 342/752 |

* cited by examiner

*Primary Examiner*—Edward Raymond
(74) *Attorney, Agent, or Firm*—Blakely, Sokoloff, Taylor & Zafman LLP

(57) ABSTRACT

A circuit and method to automatically identify and manipulate a pulse in each of a sequence of clocking signals for an integrated circuit includes a clock manipulation circuit to manipulation the identified pulse including to shrink or otherwise alter the identified pulse; and a pulse identification circuit to automatically and algorithmically identify each pulse to be shrunk.

28 Claims, 3 Drawing Sheets

ON-DIE AUTOMATIC SELECTION OF MANIPULATED CLOCK PULSE

TECHNICAL FIELD

This disclosure relates generally to integrated circuit testing, and more particularly to a built-in test circuit and method for automatically selecting a clock for manipulation.

BACKGROUND

Integrated circuit design and test engineers seek to debug (or rootcause) all speed-related failures of an integrated circuit so that the integrated circuit can run faster. In order to debug or (rootcause) all speed related failures of a circuit, it is necessary to isolate timing related paths in the circuit so that these paths can alternatively be eliminated from the circuit, or can have their processing speed increased.

A technique of isolating the paths in an integrated circuit is to iteratively alter (by increasing for example) the frequency of suspected slow clocks in the clocking signal to the circuit of at least one particular clock(s) in an iteration, exercising the circuit with the clocking signal for each changed clocking signal in the iteration, and collecting the result of the exercising in each iteration by using latching elements coupled to the circuit to save the state of selected circuit portions at a determined time, and ascertaining in each iteration which if any circuit portions have failed to perform properly. In each iteration, a different particular pulse(s) in the clock signal is altered from a nominal value and/or the amount of the altering of at least one particular clock pulse is changed. A particular clock pulse can be altered by manipulating the clock frequency on a phase by phase basis through changing the rising edge timing or falling edge timing independently and/or in combination with each other.

The integrated circuit is disposed on at least one die. Coupled to the integrated circuit on the die(s) is a clock-generating circuit for typically, but not limited to, raising the frequency of a clocking signal generated by a coupled tester to a determined clocking signal frequency for the integrated circuit, and/or regulating the clocking signal. The integrated circuit includes a DFT (Designed For Test) pulse (or clock)-manipulating circuit coupled to the clock-generating circuit to manipulate at least one defined pulse in the clocking signal output generated by the clock-generating circuit. The pulse-manipulating circuit is used to iteratively alter a pulse (or clock) in the integrated circuit clocking signal as described above with reference to the technique of isolating a path.

A test system for the functional test of the integrated circuit conventionally includes a tester coupled to the integrated circuit through terminals, and the tester itself coupled to a computing device workstation. In operation, the tester in an iterative manner, transmits at least one test-data sequence of pulses, and a tester clock signal, to the on-die clock-generating circuit for execution of a functional test of the integrated circuit. The test-data sequence of pulses and the test clock input in each iteration, are generally first defined in the workstation, then transmitted from the workstation to the tester, then the tester generates the test data and test clock input, and then the tester transmits them to the die.

In each iteration, the tester also transmits to the die a binary coded message, or alternatively a trigger signal in combination with an offset defined in the binary coded message, to identify the pulse(s) to be manipulated in the output of the clock-generating circuit, and how each pulse to be manipulated is to be manipulated. The binary coded message is conventionally sent to the die as a header or preconditioning region of the test (or test pattern) in the tester. In an iteration, the workstation first defines the binary message content and trigger timing, the workstation transmits the trigger data and the binary message content to the tester, the tester constructs the binary message, and the tester transmits the trigger and the message to the die. In each iteration, each transmission of the trigger and the binary data message to the die causes the DFT to reinitialize, and to parse and to decode the message before clocking the manipulated clocking signal and executing the test data input. The workstation/tester—circuit-under-test interaction slows down significantly the throughput of testing.

What is needed is an apparatus and method to automatically select the pulse(s) to manipulate on the die(s) so as to eliminate the overhead of the tester and workstation generating a binary data message and the DFT re-initializing, in order to increase the rate of test.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified. The order of description should not be construed as to imply that these operations are necessarily order dependent.

DETAILED DESCRIPTION

Embodiments of an apparatus and method for automatically identifying at least one clock (or pulse) to be manipulated (such as by shrinking) in a sequence of clock signals for an integrated circuit, and manipulating that pulse by on-die circuitry, are described herein. In the following description, numerous specific details are provided thoroughly understanding the embodiments of the present invention. One skilled in the relevant art will recognize, however, that the invention can be practiced without one or more of the specific details, or with other steps, methods, systems, components, materials, etc. In other instances, well-known structures, materials, system components, or steps of methods are not shown, or if shown are not described in detail, to avoid obscuring aspects of the invention.

Reference throughout this specification to "one embodiment" or "an embodiment" means that a particular feature, structure, step, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, steps, or characteristics may be combined in any suitable manner in one or more embodiments.

Various operations will be described as multiple discrete steps performed in turn in a manner that is most helpful in understanding the present invention. However, the order of description should not be construed as to imply that these operations are necessarily order dependent, in particular, the order the steps are presented. Any necessary ordering is alternatively expressly mentioned or will be understood by those skilled in the art.

As used herein, a scan latch comprises a clocked memory element such as a latch to hold the binary output data from a coupled portion of a circuit under test. And as used herein, a circuit comprises an interconnection of electrical elements to form at least one path for the flow of electrical current.

Figure 1:
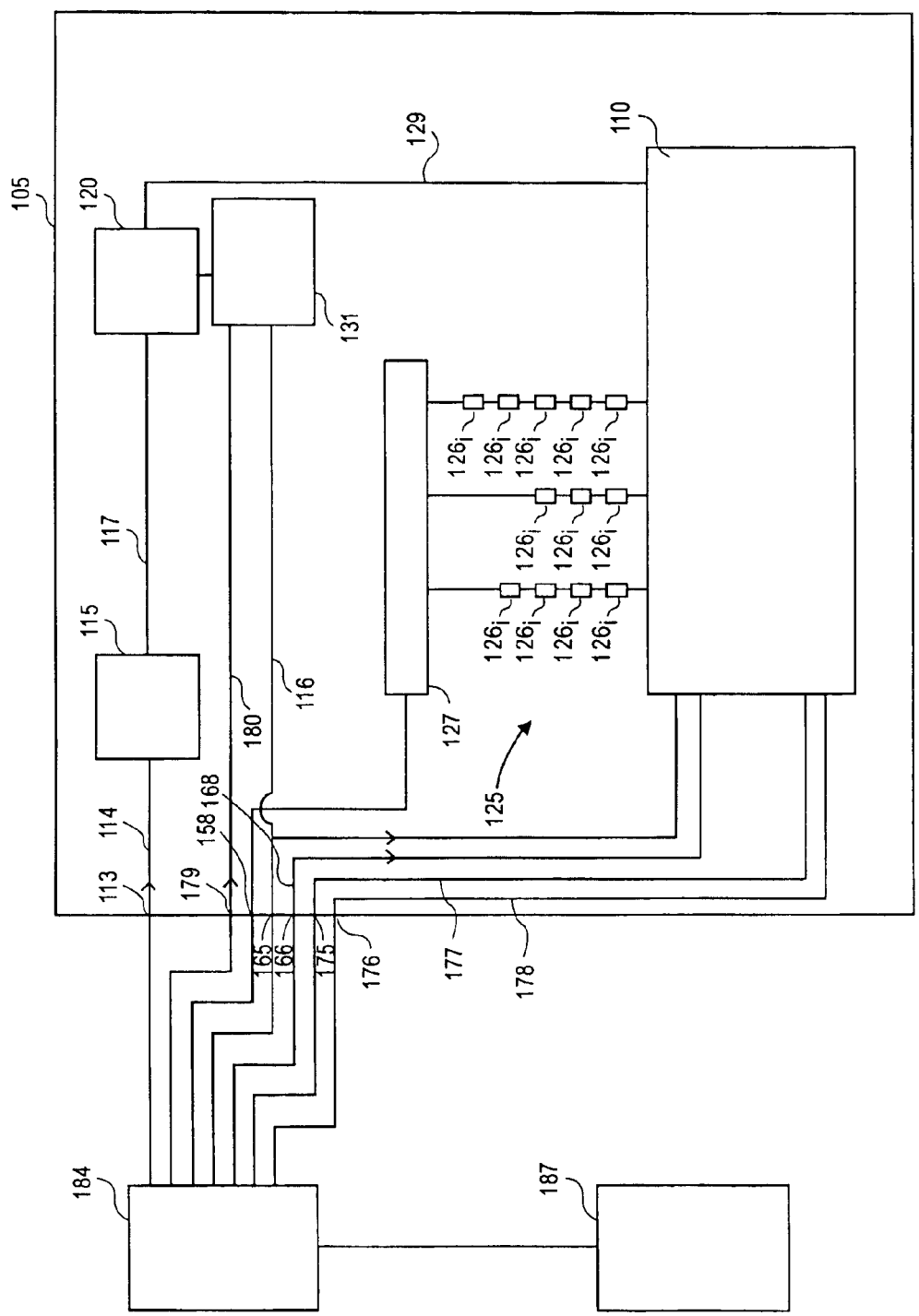
FIG. 1 portrays an embodiment of a functional block diagram of a test system to test an integrated circuit that includes a die having the circuit-under-test and a built-in-test circuitry, a tester; and a workstation computing device for deriving, storing, and analyzing latched circuit states.

Referring now to FIG. 1, an integrated circuit on at least one die and coupled terminals 105 includes a circuit-under-test 110, and support and DFT circuitry to be presently described.

A terminal (or port) 113 is coupled to a tester 184 (that is itself coupled to a computing device workstation 187) to conventionally receive a clocking signal sequence of pulses from the tester 184. The clocking signal from the tester 184 is transmitted along a signal path 114 to a coupled Phase Locked Loop (PLL) circuit 115, or other circuit well known to those skilled in the art, to at least raise the frequency of the clock signal from the tester 184 to a preferred clock frequency, and/or assure a synchronized predictable clock. The output of the PLL circuit 115 is a stable clocking signal sequence of pulses at the preferred frequency for the circuit-under-test 110. The output of the PLL circuit 115 passes through a coupled signal path 117, to a coupled clock-manipulation circuit 120.

The clock (or pulse)-manipulation circuit 120 selectively manipulates a clock (or pulse) frequency through changing the rising edge timing, the falling edge timing, or the clock voltage of at least one clock (or pulse) of the clocking signal output from the PLL circuit 115. A clock-manipulation circuit 120 is know in the prior art and disclosed for changing the leading edge or falling edge timing (or frequency) in U.S. Pat. No. 6,127,858, "Method And Apparatus For Varying A Clock Frequency On A Phase By Phase Basis", and assigned to the assignee of this application. In application, this manipulation is preferably a frequency increase in the clock that is commonly termed clock-shrinking. As used herein, frequency refers to the reciprocal of the period between the pulse to be manipulated by a frequency change and the immediately preceding pulse, for the leading edge and/or the trailing edge. The output of the clock-manipulation circuit 120 is a core clocking signal to the circuit-under-test 110 having the waveform of the output of the PLL circuit 115 except the pulses selectively manipulated by the clock-manipulation circuit 120. The output of the clock-manipulation circuit 120 passes through a path 129 to the circuit-under-test 110.

The clock-manipulation circuit 120 is coupled to a clock-identification circuit 131. The clock-identification circuit 131 is to automatically identify to the clock-manipulation circuit 120 the specific clocks (or pulse(s)) to be manipulated by the clock-manipulation circuit 120 for each of a plurality of sequential tests from an initial core clock pulse defined by the workstation 187 or tester 184. Automatically (and "automatic") herein means that the selection (or identification or determination) of a clock pulse to shrink (or otherwise manipulate, alter, or transform) is selected (or identified or determined) within the die(s) by on-die circuitry and does not require a transmission from outside the die(s), such as from the workstation 187 or the tester 184.

The clock-identification circuit 131 is coupled to receive from the tester 184 an identification of the initial pulse(s) to be manipulated, and an identification of a target condition for terminating the iterative identifying of a next pulse to be manipulated by the clock-manipulation circuit 120, described below. The initial core clock pulse location has been illustratively described in operation above as being determined by both a trigger signal, and a core clock identified by data. It is specifically within the contemplation of the present invention that the initial core clock pulse location and/or the target condition for terminating the identifying of a next pulse in an embodiment is also determined by selection circuitry within the die(s). The identifications that the clock-identification circuit 131 receives from the tester 184 above, are preferably in a header transmitted from the tester 184 to the die 105. The DFT circuit is to send the pulse identification data of the header of the clocking signal output from the tester 184 to the die 105 along a path 116, the remainder of the header conventionally going to the clock-manipulation circuit 120.

The tester 184 transmits the header preferably in the data signal output to the die 105 illustratively described below with reference to one of the terminal 165 and 166. The header will include a binary coded message having the identification of the core clocking signal pulse from a reference trigger signal, an identification of a target condition for terminating the identification of a next pulse, an identification of the leading edge and/or the trailing edge that the transformation applies to, an identification of the amount of change to the leading edge, if any, and to the trailing edge, if any, and whether the amount of change is an increase in frequency or a decrease in frequency. The selection of a protocol to define the format and content of the header is well understood by those skilled in the art.

In another embodiment, the header may be attached to the clocking signal output to the die illustratively at the terminal 113. It is within the specific contemplation of the present invention that the header information may be transmitted to the die 105 with another signal or alone, and by a different port than is described herein, as is well known to those skilled in the art. It is within the specific contemplation of the present invention that there is a trigger reference signal and the header information in conjunction with the trigger includes the information to identify a specific pulse of the PLL circuit 115 output signal, and that there is no trigger reference signal and the header information alone includes the information to identify a specific pulse (or sequence of pulses) of the PLL circuit 115 output signal.

The tester 184 additionally transmits to the die 105 a reference trigger signal disclosed in the preceding paragraph. In an embodiment, the reference trigger signal is illustratively transmitted at a coupled terminal (or port) 179. The terminal 179 is coupled to the clock-identification circuit 131 through a signal path 180. It is within the specific contemplation of the present invention that the trigger reference signal may be transmitted to the die 105 with another signal or by a different port than is described herein as is well known to those skilled in the art.

The clock-identification circuit 131 eliminates the need to derive and to transmit both an identity of the clock pulse to shrink or otherwise manipulate a pulse from the tester-workstation 184–187 combination in a header block and a trigger, each time a pulse to be manipulated by the clock-manipulation circuit 120 after the initial header transmission. The clock-identification circuit 131 algorithmically selects the pulse(s) for each test. In the preferred embodiment, the clock-identification circuit 131 auto-increments by a value of 1 the initial pulse as will be described with reference to FIGS. 3 and 4.

The circuit-under-test 110 in operation is conventionally coupled to a DFT circuit that includes an at least one scan chain 125, each scan chain having coupled individual scan latches 126*i* or other memory elements that are each coupled (not shown) to a separate portion of the circuit-under-test 110, as is well known to those skilled in the art. Each scan latch 126*i* is to save a signal state of a coupled portion of the circuit-under-test 110 in response to a latch command. The scan latches 126*i* unload through a circuit 127 to a terminal (port) 158, wherein the data comprising the unload in operation is transmitted to the tester 184. The die(s) may also include a signature generator (not shown) to transform the unloaded scan latch 126*i* states to a signature, the signature generator coupled to port 158, rather than the unload circuit 127.

The circuit-under-test 110 is coupled illustratively to two data input terminals (or ports) 165 and 166, to couple to the tester 184. The tester 184 is to provide to the terminals 165 and 166 two input test data sequence of pulses that are transmitted respectively along the paths 167 and 168 to the circuit-under-test 110 as input data signals to the circuit-under-test 110. The circuit-under-test 110 is further illustratively coupled to two data output terminals (or ports) 175 and 176, to couple to the tester 184 to provide two output pulse signals to the tester 184 that are transmitted respectively along the paths 177 and 178.

In operation of the circuit-under-test 110 and the on-die DFT units that include the clock-identification circuit 131 and the clock-manipulation circuit 120, the clocking signal is input into the circuit-under-test 110, and the response of circuit-under-test 110 is observed through the two data output terminals 175 and 176 and compared against a determined value in order to identify any timing critical path(s). In an initial iteration, header information described above and the reference trigger are input from a tester 184 to both the clock-manipulation circuit 120 and the clock-identification circuit 131. The clock-manipulation circuit 120 interprets the header information to manipulate at least one pulse in a clocking signal transmitted by the PLL circuit 115, that is input to the circuit under test 110. In a next iteration, rather than having a header and a reference trigger re-transmitted from the tester 184, the clock-identification circuit 131 algorithmically and automatically identifies a next at least one pulse and transmits an identification of the pulse to the clock-manipulation circuit 120 and the clock-manipulation circuit 120 iteratively manipulates another at least one pulse of a new clocking signal output from the PLL circuit 115, and the response of the circuit-under-test 110 is again tested for a pass or fail result. The clock-identification circuit 131 is to preferably input the clock identification to the clock-manipulation circuit 120 as a trigger signal and clock signal referenced to the trigger to maintain the protocol of prior art clock manipulation by tester clock identification. Each iteration is repeated with the clock-identification circuit 131 automatically identifying to the clock-manipulation circuit 120 *a* pulse(s) to be manipulated, and the clock-manipulation circuit 120 manipulating the pulse(s) for a determined number of iterations identified preferably by the target condition, to terminate the identification of a next pulse described below. It is specifically within the contemplation of the present invention that the initial pulse in an embodiment be identified by the clock-identification circuit 131 on other DFT circuitry (not shown).

Figure 2:
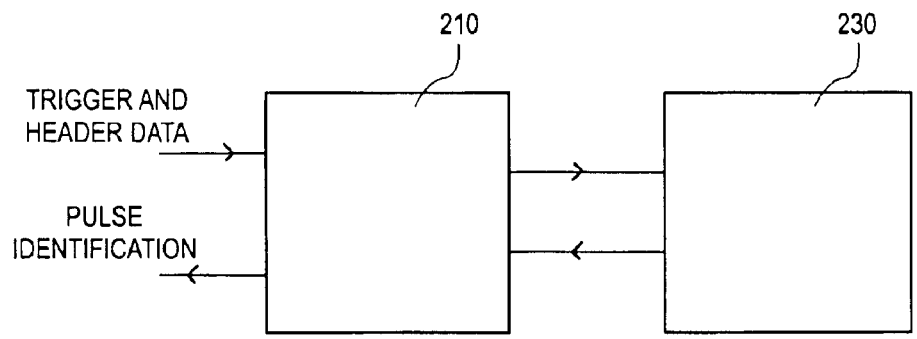
FIG. 2 portrays an embodiment of a clock-identification circuit.

Referring now to FIG. 2, the clock-identification circuit 131 receives in an embodiment the trigger reference signal from the port 179 though the signal path 180, and the pulse identification and target terminating condition data of the header data described above through the signal path 116. The clock-identification circuit 131 includes a control circuit 210 to transmit and receive signals from outside the clock-identification circuit 131 and to transmit and receive signals to the clock-determination circuit 230 portrayed herein and in FIG. 3. In an embodiment, the control circuit 210 receives the trigger reference signal from the port 179 though the signal path 180, and the pulse identification data and the target condition for terminating the identification of a next pulse of the header 133 through the signal path 116. The control circuit 210 transmits an initial pulse manipulation identification signal, and a target condition for terminating the identification of a next clock signal, to the clock-determination circuit 230. The control circuit 210 receives a pulse identification signal from the clock-determination circuit 230; and in response transmits a clock identification signal to the clock-manipulation circuit 120 that in an embodiment comprises a trigger reference signal and a clock identification signal offset from the trigger to replicate the interface between the tester 184 and the clock-manipulation circuit 120.

Figure 3:
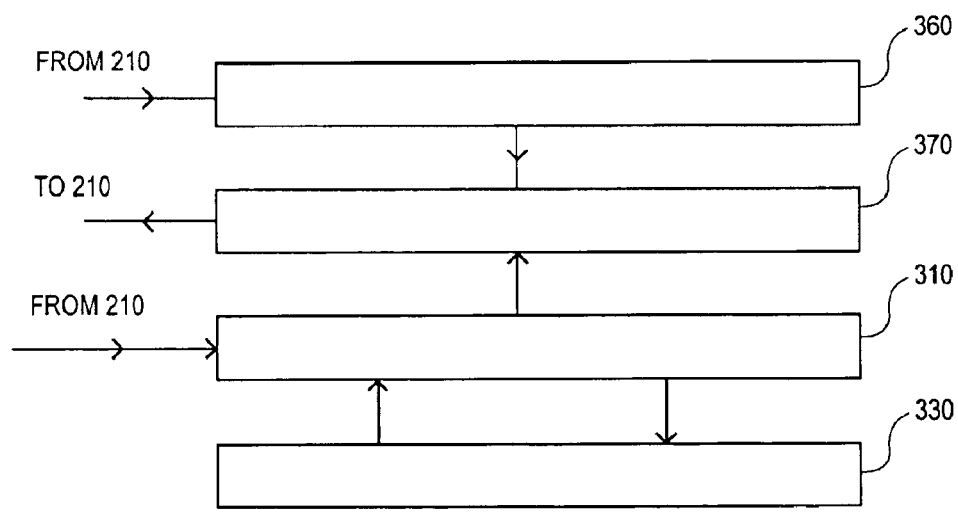
FIG. 3 portrays an embodiment of a clock-determination circuit of a clock-identification circuit.

Referring now to FIG. 3, a preferred embodiment of a pulse determination circuit 330 is implemented as an auto-increment circuit in order to increase the identified pulse by a value of 1 each test iteration. The clock-determination circuit 230 includes a current count register 310 to receive upon reset the initial pulse identification signal from the control circuit 210 (FIG. 2). The clock-determination circuit 230 includes an adder circuit 330 preferably implemented as an up-counter, coupled to the current counter 310 to increment the current count register 310 by 1 after each clocking signal transmitted by the PLL circuit 115 to realize an incrementing of the pulse count by 1 The pulse determination circuit 330 includes a target condition count register 360 to receive the target condition setting from the control circuit 210 (FIG. 2) and a coupled comparator circuit 370. The comparator circuit is coupled to the current count register 310 as well, to compare the content of the current count register 310 to the target condition count register 360, and signal a match when the current count has attained the target count value, and otherwise to issue the internal trigger to the control circuit 210 (FIG. 2). The target count register 360 additionally includes an optional output to the die 105 terminal to output to the tester 184 to enable observability by the tester/workstation 184/187 of the identified pulse. It will be clear to those skilled in the art that a different circuit of the pulse determination circuit can be implemented to realize this algorithm or a different algorithm, such as an algorithm for decrementing down or incrementing up by any number of clocks, and including an identification of a plural number of clocks for a clocking signal for the determination of the clock to manipulate, and that the present invention is not limited to the algorithm described herein. It will also be clear to those skilled in the art that instead of using as a target condition a specific clock identifier, a number of quantifiable conditions can be used such as a number of iterations or the like. The present invention also specifically includes generating the initial clock from a default condition and/or generating a target condition from a default condition, in which a coupled external circuit such as the tester 184 does not supply an initial clock and/or a target condition.

Figure 4:
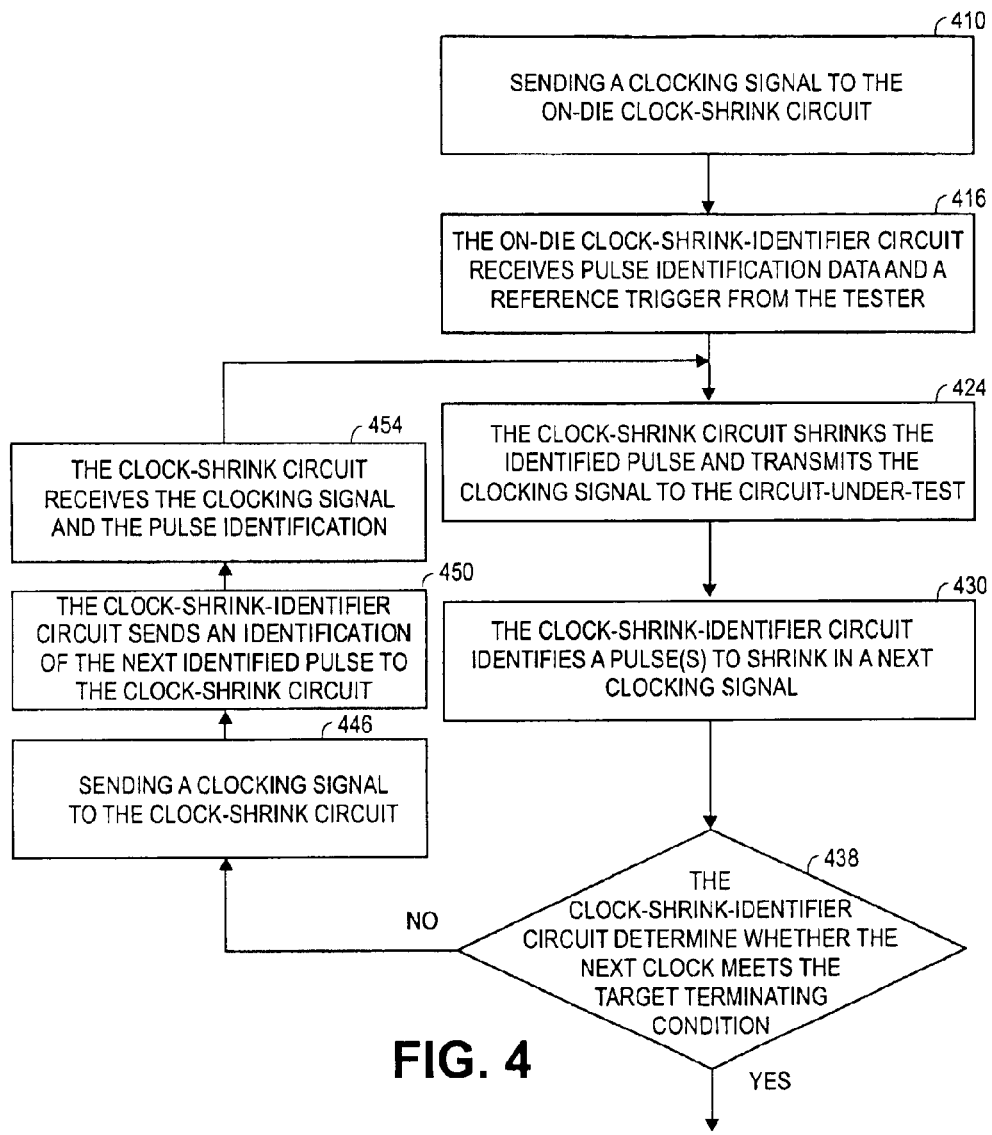
FIG. 4 is a flow chart of an embodiment of a method to automatically identify and manipulate at least one pulse of a clocking signal in each of at least one iteration. The order of description should not be construed as to imply that these operations are necessarily order dependent, or even that at least two operations cannot be implemented at least partially simultaneously.

Referring now to FIG. 4, a method includes in block 410 sending a clock signal to the on-die clock-manipulation circuit 120 to manipulate at least one clock. It is within the specific contemplation of the present invention that the manipulation includes not only the embodiment herein described of preferably shrinking a clock, but any manipulation that clock-manipulation circuit is capable of, including raising and lowering the frequency of a leading edge of a pulse, a trailing edge of a pulse, and manipulating a pulse voltage. In block 416, both an on-die clock-identification circuit 131 and the clock-manipulation circuit 120 receive data from a coupled tester to indicate a trigger keyed to a tester output clocking signal, and a data to indicate a number of core clocks that the first pulse is displaced from the trigger as described with reference to FIGS. 1, 2, and 3. The clock-identification circuit 131 additionally receives data to indicate a terminating condition such as the pulse identification at which to not manipulate the pulse. The clock-manipulation circuit additionally receives data to indicate the manipulation to be made and the amount of that manipulation as described with reference to FIG. 1.

In block 424, the clock-manipulation circuit 120 manipulates the identified pulse based on the type of manipulation and the amount of manipulation data received and transmits the clocking signal to the circuit-under-test 110. In block 430, the clock-identification circuit 131 identifies a pulse to manipulate in a next clocking signal according to an algorithm based on the identification of the first clock manipulated derived from the received trigger and the data indicating the displacement of the first clock from the trigger. It is within the specific contemplation of the present invention that this identification can be based on an indication from the clock-manipulation circuit 120 received trigger and the received indication of a number of core clocks that the clock is displaced from the trigger.

In block 438, the clock-identification circuit 131 determines whether the next clock meets the received target terminating condition and if it does not, control passes to block 446. Block 446 includes sending a clocking signal to the clock-manipulate circuit 120. In block 450, the clock-identification circuit 131 sends an identification of the identified next clock to the clock-manipulation circuit 120 as described with reference to FIGS. 1, 2, and 3. In block 454, the clock-manipulation circuit 120 receives the clocking signal, and the pulse identification from the clock-identification circuit 131, and control passes again to block 424. If in block 438 the clock-identification circuit 431 determines that the next clock meets the received target terminating condition, the process terminates.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A circuit coupled to an integrated circuit on a die that includes:

a pulse manipulating circuit to selectively manipulate at least one pulse in a clocking signal, the manipulate including at least one of increasing the frequency of a leading edge, decreasing the frequency of a leading edge, increasing the frequency of a trailing edge, decreasing the frequency of a trailing edge, and manipulating a voltage of the at least one pulse; and an identification circuit coupled to the pulse manipulating circuit to automatically identify an at least one specific pulse in each of a sequence of clock signals to be manipulated by the pulse manipulating circuit and to transmit the identified at least one pulse to the pulse manipulating circuit wherein the pulse manipulating circuit is to manipulate a frequency of each identified pulse in each clocking signal in response to the transmitted identified at least one pulse in each clock signal.

2. The circuit defined in claim 1 wherein the identification of the at least one pulse is based on an algorithm.

3. The circuit defined in claim 1 that further includes:

a clock signal generating circuit to generate each of the clocking signal, that is coupled to the pulse manipulating circuit.

4. The identification circuit defined in claim 1 that is further to determine whether to terminate the identification based on a terminating condition.

5. The circuit defined in claim 1 wherein the identification of the at least one pulse is based on a data to be transmitted to the identification circuit from a terminal of the integrated circuit.

6. The identification circuit defined in claim 1 wherein the identify is based on an algorithm that includes one of incrementing the pulse identification up in sequential clocking signals, and decrementing the pulse identification down in sequential clocking signals.

7. A method of inputting a clocking signal to an integrated circuit comprising:

(a) a clock manipulating circuit on a die receiving a clocking signal;

(b) the clock manipulating circuit manipulating an identified pulse of the clocking signal received in (a) and transmitting the clocking signal with the manipulated identified pulse to the integrated circuit;

(c) a clock manipulation identifier circuit on a die automatically identifying a specific pulse to manipulate for a next clocking signal;

(d) sending a next clocking signal to the clock manipulating circuit;

(e) the clock manipulating circuit sending the pulse identified in (c) to the clock manipulating circuit;

(f) the clock manipulating circuit receiving the pulse sent in (e); and (g) the clock manipulating circuit manipulating the pulse received in (f) in the next clocking signal sent in (d), and transmitting the clocking signal with the manipulated identified pulse to the integrated circuit.

8. The method defined in claim 7 further including determining whether the next clock meets a target terminating condition and if it does not, repeating (c), (d), (e), (f), and (g).

9. The method defined in claim 8 wherein the determining is based on a data transmitted to a terminal of the die.

10. The method defined in claim 7 wherein the manipulating the pulse and the manipulating an identified pulse includes at least one of increasing a frequency of a leading edge, decreasing a frequency of a leading edge, increasing a frequency of a trailing edge, a decreasing a frequency of a trailing edge, and manipulating a voltage of the pulse.

11. The method defined in claim 7 wherein the clock manipulation identifier circuit identifying a pulse depends upon one of a predetermined basis and received basis.

12. The method defined in claim 11 wherein the received basis includes an identified pulse transmitted to a terminal of the die.

13. The method defined in claim 7 wherein the clock manipulation identifier circuit identifying a pulse is determined by an algorithm.

14. An integrated circuit that includes:

pulse transforming means for transforming at least one pulse in each of a plural number of received clocking signals, the transforming including at least one of increasing the frequency of a leading edge, decreasing a frequency of a leading edge, increasing a frequency of a trailing edge, decreasing a frequency of a trailing edge, and transforming at least one voltage of the pulse; and identification means for automatically identifying an at least one pulse in each of the plural number of clocking signals, for transmitting the identified at least one pulse to the pulse transforming means, and for determining whether to terminate the identification based on a terminating condition.

15. The integrated circuit defined in claim 14 that further includes clock generating means to generate each of the clocking signal, that is coupled to the pulse transforming means.

16. The identification means defined in claim 14 wherein the terminating condition is to be transmitted to a terminal of the integrated circuit.

17. The identification means defined in claim 14 wherein the identifying is based on an algorithm.

18. The identification means defined in claim 17 wherein the algorithm includes at least one of incrementing the identified pulse in each successive clock signal and decrementing the identified pulse in each successive clock signal.

19. The identification means defined in claim 14 further for determining whether to terminate the identifying based on a terminating condition.

20. The identifying means defined in claim 19 wherein the condition is based on data to be transmitted to the identifying means from a terminal of the integrated circuit.

21. An integrated circuit that includes:

a pulse transforming circuit to transform at least one pulse in each of a plural number of received signals, the transform including at least one of increasing the frequency of a leading edge, decreasing a frequency of a leading edge, increasing a frequency of a trailing edge, decreasing a frequency of a trailing edge, and transforming at least one voltage of the pulse; and an identification circuit to automatically identify an at least one pulse in each of the plural number of signals, to transmit the identified at least one pulse to the pulse transforming circuit, and to determine whether to terminate the identification based on a terminating condition.

22. The integrated circuit defined in claim 21 that further includes a clock generating circuit to generate each of the clocking signal, that is coupled to the pulse transforming circuit.

23. The identification circuit defined in claim 21 wherein the terminating condition is to be transmitted to a terminal of the integrated circuit.

24. The identification circuit defined in claim 21 wherein the identification of the at least one pulse is based on an algorithm.

25. The identification circuit defined in claim 24 wherein the algorithm includes at least one of incrementing the identified pulse in each successive clock signal and decrementing the identified pulse in each successive signal.

26. The identification circuit defined in claim 21 further to determine whether to terminate the identifying based on a terminating condition.

27. The identifying circuit defined in claim 26 wherein the condition is based on data to be transmitted to the identifying circuit from a terminal of the integrated.

28. The integrated circuit defined in claim 21 wherein the received signals include clocking signals.

\* \* \* \* \*